United States Patent [19]

Awaji et al.

[11] Patent Number: 5,849,857

[45] Date of Patent: *Dec. 15, 1998

[54] PRODUCTION METHOD FOR PHOTO-SENSITIVE RESIN AND LIQUID PHOTO-SENSITIVE RESIN COMPOSITION

[75] Inventors: Toshio Awaji, Kawanishi; Nobuaki Ohtsuki, Suita; Motohiro Arakawa, Takatsuki, all of Japan

[73] Assignee: Nippon Shokubai Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 640,859

[22] PCT Filed: Sep. 13, 1995

[86] PCT No.: PCT/JP95/01828

§ 371 Date: May 14, 1996

§ 102(e) Date: May 14, 1996

[87] PCT Pub. No.: WO96/08525

PCT Pub. Date: Mar. 21, 1996

[30] Foreign Application Priority Data

Sep. 14, 1994 [JP] Japan ................................. 6-220429
Jul. 19, 1995 [JP] Japan ................................. 7-183061

[51] Int. Cl.$^6$ .................................................. C08G 59/16
[52] U.S. Cl. ........................... 528/98; 528/100; 525/438; 525/444; 525/451; 430/285.1; 522/100
[58] Field of Search ...................... 430/285.1; 522/100; 528/100, 98; 525/451, 438, 444

[56] References Cited

U.S. PATENT DOCUMENTS 4,187,257  2/1980  Nielsen ................... 522/100
4,714,751  12/1987  Schornick et al. ............. 430/285.1 X
4,725,524  2/1988  Elzer et al. ................. 430/285.1 X
5,009,982  4/1991  Kamayachi et al. ............. 522/100 X

FOREIGN PATENT DOCUMENTS 7-36183A  2/1995  Japan ................... 430/285.1
2235925  3/1991  United Kingdom ........... 522/100

Primary Examiner—Cynthia Hamilton
Attorney, Agent, or Firm—Oblon, Spivak, McClelland, Maier & Neustadt, P.C.

[57] ABSTRACT

The present invention provides a production method for a photo-sensitive resin, characterized in reacting a difunctional epoxy resin (B) having two epoxy groups in a molecule with carboxyl groups contained in a resin (A) having two or more (meth)acryloyl groups and at least one carboxyl group in a molecule. Since the photo-sensitive resin prepared by extending the resin (A) to a high molecular weight linearly via the difunctional epoxy resin (B) is obtained, a resist layer having an excellent tack-free property can be formed. Further, a resist layer irradiated with rays through a patterning film can be developed rapidly and correctly in an alkaline aqueous solution. Accordingly, it has been possible to provide the high-performance liquid photo-sensitive resin compositions useful for a solder resist used for producing printed circuit boards and for an electroless plating resist or useful for producing black matrices and color filters for liquid crystal displays. Further, the coated layer formed by photo-curing the liquid photo-sensitive resin composition containing the polymer fine particles having a Tg of 20° C. or lower has an advantage that the coated layer provides an excellent adhesion even if it is exposed to a heating process.

8 Claims, No Drawings

PRODUCTION METHOD FOR PHOTO-SENSITIVE RESIN AND LIQUID PHOTO-SENSITIVE RESIN COMPOSITION

BACKGROUND OF THE INVENTION

1. Field of the Invention

The present invention relates to a photo-sensitive resin material suitable for a solder resist for producing a printed circuit board, an electroless plating resist, an insulating layer formed on a printed circuit board by a build-up method, and a black matrix and a color filter for producing a liquid crystal display, more specifically to a method for producing a photo-sensitive resin capable of forming a coated layer which has a high sensitivity to exposure to UV rays and a good developability in an alkaline aqueous solution and which has a less change with time in the developability and a cured coated layer which is excellent in electrical characteristics, mechanical characteristics, heat resistance, and chemical resistance, and a liquid photo-sensitive resin composition.

2. Description of the Related Art

In recent years, shifting IC and VLSI to higher densities has been accompanied with increasingly shifting a printed circuit board to a higher density and finer patterns and has necessitated a decrease in a circuit width and a circuit space. Accordingly, excellent accuracy of dimension and resolution have been required as well to a solder resist and an electroless plating resist more than ever.

In order to form a solder resist on a printed circuit board, there has generally been employed a method in which a heat-curable or photo-curable type resist ink is used to form patterns by screen printing and a transferred part is heat-cured or photo-cured. However, since the screen printing has limits in forming fine patterns, a progress of a printed circuit board to high density and minuteness has been accompanied with shifting to a developing type resist to which a principle of photo-imaging is applied. A dry film has been applied to a developing type resist-forming method at the beginning. However, because of a problem that bubbles are liable to be formed in compressing to a substrate, a liquid developing type resist in which coating method is not limited has been highlighted at present. In particular, an alkali developing type capable of being developed in a diluted weak alkaline aqueous solution has been mainly used in terms of an environmental measure, and carboxyl group-containing epoxy (meth)acrylate obtainable by reacting acid anhydride with epoxy (meth)acrylate obtainable by reacting an epoxy resin with (meth)acrylic acid to introduce the carboxyl group is used as a photo-sensitive resin for an alkali developing type resist (for example, Japanese Patent Laid-Open No. 61-243869 (USP 5,009,982) and Japanese Patent Laid-Open No. 63-258975).

In a method for forming patterns with a liquid developing type resist comprising a photo-sensitive resin composition suitable for a solder resist for producing a printed circuit board, an electroless plating resist, an insulating layer formed on a printed circuit board by a build-up method, and a black matrix and a color filter for producing a liquid crystal display, employed is a series of steps in which first of all, a resist is applied on a printed circuit board and dried by heating to form a coated layer, and then a pattern-forming film is compressed on this coated layer, followed by exposing and developing. However, there has been involved in this method, the problem that if tackiness remains on the coated layer after drying by heating in the steps described above, a part of the resist adheres to a pattern-forming film after peeling off, which makes it impossible to reproduce the patterns correctly or peel off the pattern-forming film. Accordingly, a tack-free property after forming a coated and dried layer is an important requisite characteristic for the liquid developing type resist.

Further, an alkali developability after exposing is an important characteristic as well. That is, in order to form fine patterns with a high reliability at a good reproducibility, an unexposed part of a coated layer has to be removed rapidly in developing. However, the alkali developability and the tack-free property described above are inconsistent characteristics, and trying to improve the developability tends to deteriorate the tack-free property, so that a photo-sensitive resin for an alkali developing type resist satisfying both important characteristics has been desired to appearance. Further, the problem has recently been caused that exposing to high temperatures for a long time after forming resist patterns causes volumetric shrinkage attributable to heat shock and an advance in a cross-linking reaction to generate cracks on the coated layer or cause the resist patterns to peel off from a substrate.

A black matrix and a color filter used for a liquid crystal display have so far been formed by applying acrylic photo-sensitive resin composition solutions colored to black, red, green, and blue on a substrate by spin coating to put a pattern-forming glass plate thereon, then curing necessary parts by irradiating with active energy rays, and dissolving non-cured parts with a solvent to remove them. However, a heating step at high temperatures of 200° C. or higher is included in production steps for a liquid crystal display, so that a problem on a heat resistance has been involved in the black matrix and color filter comprising an acrylic photo-sensitive resin. In order to enhance the quality of a liquid crystal display, the high reliability is required also in the black matrix and the color filter as shifting to fine patterns advances, and a photo-sensitive resin which is excellent in accuracy of dimension and resolution is required as is the case with a solder resist field. Further, since an organic solvent-developing type has been mainly employed in the acrylic photo-sensitive resin, shift to an alkali developing type has been necessitated as well in a photo-sensitive resin for a black matrix and a color filter from the viewpoint of an environmental measure.

SUMMARY OF THE INVENTION

Accordingly, an object of the present invention is to provide a method for producing a photo-sensitive resin capable of forming a coated layer which has a high photo-sensitivity and an excellent tack-free property and which can be rapidly and accurately developed in a weak alkaline aqueous solution and a cured coated layer which is excellent in adhesion to a substrate, chemical resistance, and heat resistance.

An another object of the present invention is to provide a liquid photo-sensitive resin composition capable of solving the preceding problems involved in conventional liquid developing type resists used for a solder resist for producing a printed circuit board, an electroless plating resist, an insulating layer formed on a printed circuit board by a build-up method, and a black matrix and a color filter for producing a liquid crystal display.

The present invention provides a production method for a photo-sensitive resin comprising reacting a resin (A) having two or more (meth)acryloyl groups and at least one carboxyl group in a molecule with a difunctional epoxy resin (B) having two epoxy groups in a molecule. According to the present invention, there can be produced a linear high molecular weight photo-sensitive resin by extending the photo-curable resin (A) with the difunctional epoxy resin (B). Further, included as well in the present invention is a production method comprising reacting the resin (A) having two or more (meth)acryloyl groups and at least one carboxyl group in a molecule with the difunctional epoxy resin (B) having two epoxy groups in a molecule and further reacting the resulting resin with a polybasic acid anhydride (II). According to this method, a photo-sensitive resin having more excellent alkali developability can be produced.

The difunctional epoxy resin (B) is preferably a bisphenol type epoxy resin or a diglycidyl ether type epoxy resin obtainable by reacting epichlorohydrin with dihydric alcohols which are polyalkylene glycols or adducts of alkylene oxides to bisphenol compounds.

The resin (A) is also preferably a resin obtainable by reacting (meth)acrylic acid (I) with an epoxy resin (C) having two or more epoxy groups in a molecule and then reacting the resulting resin with the polybasic acid anhydride (II), or a resin obtainable by reacting (meth)acrylic acid (I) and alkylphenol (III) represented by the following formula with an epoxy resin (C) having three or more epoxy groups in a molecule and then reacting the resulting resin with the polybasic acid anhydride (II):

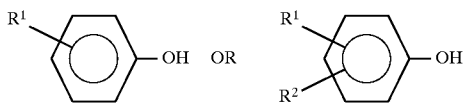

wherein $R^1$ and $R^2$ may be the same as or different and represent a saturated or unsaturated alkyl group having 5 to 35 carbon atoms.

A bisphenol type epoxy resin having two epoxy groups in a molecule or a novolak type epoxy resin having three or more epoxy groups in a molecule is preferably used as the epoxy resin (C) described above.

In the present invention, it is recommendable to react the above resin (A) with the above difunctional epoxy resin (B) in a proportion of 0.1 to 0.8 chemical equivalent of the epoxy group in the difunctional epoxy resin to 1.0 chemical equivalent of the carboxyl group in the resin (A).

The liquid photo-sensitive resin composition capable of achieving the preceding second object of the present invention, which can be obtained by applying the preceding production method of the present invention, comprises the photo-sensitive resin obtainable by reacting the resin (A) having two or more (meth)acryloyl groups and at least one carboxyl group in a molecule with the difunctional epoxy resin (B) having two epoxy groups in a molecule, a photo-polymerization initiator, and a diluent.

Further, a liquid photo-sensitive resin composition comprising a photo-sensitive resin, polymer fine particles (D) having a glass transition temperature of 20° C. or lower, a photo-polymerization initiator, and a diluent can achieve as well the preceding second object of the present invention. In the above case, the photo-sensitive resin may be the resin (A) having two or more (meth)acryloyl groups and at least one carboxyl group in a molecule. As a matter of course, there may be used a resin obtainable by reacting the above resin (A) with the difunctional epoxy resin (B) having two epoxy groups in a molecule.

Preferred Embodiments of the Invention

Intensive investigations made by the present inventors in order to achieve the objects described above have resulted in finding that a photo-sensitive resin obtainable by reacting a part of the carboxyl groups contained in the resin (A) having two or more (meth)acryloyl groups and at least one carboxyl group with the difunctional epoxy resin (B) to extend the above resin (A) to a linear high molecular weight resin can display a good tack-free property and alkali developability at the same time. That is, the photo-sensitive resin obtained by the method of the present invention exhibits a good alkali developability while having an excellent tack-free property since the resin itself has a high molecular weight. The present invention will be explained below in detail.

In the method of the present invention, the resin (A) having two or more photopolymerizable (meth)acryloyl groups and at least one carboxyl group necessary for displaying an alkali developability is reacted with the difunctional epoxy resin (B). As the resin (A) in the present invention, a photo-sensitive resin obtainable by using the epoxy resin (C) having two or more epoxy groups in a molecule as a starting material and reacting this with (meth)acrylic acid (I), a polybasic acid anhydride (II), and if necessary, alkylphenol (III) can be preferably used.

The epoxy resin (C) which is a starting material for the resin (A) is not specifically restricted, and any resins can be used as long as they are known epoxy resins having two or more epoxy groups in a molecule. Among them, bisphenol type epoxy resins and novolak type epoxy resins are preferred since they show excellence in electrical characteristics, heat resistance, and chemical resistance. The examples of the bisphenol type epoxy resin include bisphenol A type epoxy resins, tetrabromo-bisphenol A type epoxy resins, bisphenol S type epoxy resins, bisphenol F type epoxy resins, and so on.

The examples of the novolak type epoxy resin having three or more epoxy groups in a molecule include not only novolak type epoxy resins derived from resins having novolak skeletons obtained by reacting phenol compounds such as phenol and cresol with aldehydes in the presence of an acid catalyst, but also epoxy resins derived from polyhydric phenol compounds obtained by reacting phenol compounds with diolefin compounds such as divinylbenzene and dicyclopentadiene in the presence of an acid catalyst. Among them, preferably used are phenol novolak type epoxy resins, brominated phenol novolak type epoxy resins, cresol novolak type epoxy resins, and bisphenol A novolak type epoxy resins.

The resin (A) can be obtained by reacting (meth)acrylic acid (I) with the epoxy groups contained in the epoxy resin (C) which is the starting material described above to introduce two or more (meth)acryloyl groups into the resin and then combining a polybasic acid anhydride (II) by monoesterification with hydroxyl groups formed by ring-opening of the epoxy groups to introduce carboxyl groups into the above resin.

In the reaction of the (meth)acrylic acid (I) and the polybasic acid anhydride (II) with the epoxy resin (C) which is the starting material, the *(meth)acrylic acid (I) and the polybasic acid anhydride (II) may be reacted all together with the epoxy resin (C), but considering a forming reaction of the hydroxyl groups (a ring-opening reaction of the epoxy groups), more preferred is a method in which the epoxy resin (C) is reacted first with the (meth)acrylic acid (I) and then with the polybasic acid anhydride (II).

In the reaction of the epoxy resin (C) with (meth)acrylic acid (I), 0.8 to 1.1 chemical equivalent of (meth)acrylic acid (I) is reacted with 1 chemical equivalent of the epoxy groups contained in the epoxy resin (C) so that the carboxyl groups of (meth)acrylic acid (I) become almost the same equivalent. This reaction can be carried out at 80° to 130° C. in the presence or absence of a diluent described later in the coexistence of a polymerization inhibitor such as hydroquinone, monomethyl ether hydroquinone, and oxygen, and a reaction catalyst such as tertiary amines, tertiary phosphines, lithium chloride, quaternary ammonium salts, and quaternary phosphonium salts.

When the epoxy resin (C) which is the starting material is an epoxy resin having three or more epoxy groups in a molecule, alkylphenol (III) represented by the following formula may be reacted with the epoxy groups contained in this epoxy resin together with (meth)acrylic acid (I):

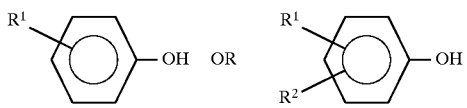

wherein $R^1$ and $R^2$ may be the same as or different and represent a saturated or unsaturated alkyl group having 5 to 35 carbon atoms.

The resulting photo-sensitive resin is improved in a flexibility and a chemical resistance of the coated layer obtained after curing by introducing the alkylphenol (III) described above into the resin (A), and this is considered an effect provided by the introduction of a long-chain alkyl group portion contained in the alkylphenol.

When the alkylphenol (III) is reacted with the epoxy. resin (C) which is the starting material together with the (meth) acrylic acid (I), the sum of (I) and (III) is preferably adjusted to 0.8 to 1.1 chemical equivalent per 1 chemical equivalent of the epoxy groups contained in the epoxy resin (C) so that the sum of the carboxyl groups of the (meth)acrylic acid (I) and the hydroxyl groups of the alkylphenol (III) becomes the same equivalent. Further, the equivalent ratio of the both is controlled to (1:1) to (99:1) in terms of (I):(III). If the equivalent ratio of the both falls in the outside of this range, the alkylphenol (III) increases more than the (meth)acrylic acid (I), and the amount of the photopolymerizable (meth) acryloyl groups contained in the resin (A) is reduced, that is, the amount of photopolymerizable double bonds contained in the finally resulting photo-sensitive resin is reduced. Accordingly, it is not preferred.

The reaction of the epoxy resin (C) with the (meth)acrylic acid (I) results in ring-opening the epoxy groups to form hydroxyl groups and introduce two or more (meth)acryloyl groups into the epoxy resin (C) at the same time. The reaction of 0.1 to 1.0 chemical equivalent of the polybasic acid anhydride (II) with 1.0 chemical equivalent of the resulting hydroxyl groups to introduce at least one carboxyl group by monoesterification can provide the resin (A). The polybasic acid anhydride (II) less than 0.1 chemical equivalent decreases the amount of the carboxyl groups introduced into the resulting resin (A) and does not provides the alkali developability.

The examples of the polybasic acid anhydride (II) include dibasic acid anhydrides such as phthalic anhydride, succinic anhydride, maleic anhydride, tetrahydrophthalic anhydride, hexahydrophthalic anhydride, methyltetrahydrophthalic anhydride, 3,6-endomethylenetetrahydrophthalic anhydride, methylendomethylenetetrahydrophthalic anhydride, tetrabromophthalic anhydride, and trimellitic anhydride , and aliphatic or aromatic tetrabasic acid dianhydrides such as biphenyltetracarboxylic acid dianhydride, naphthalenetetracarboxylic acid dianhydride, diphenyl ether tetracarboxylic acid dianhydride, butanetetracarboxylic acid dianhydride, cyclopentanetetracarboxylic acid dianhydride, pyromellitic anhydride, and benzophenonetetracarboxylic acid dianhydride. At least one of them can be used.

The monoesterification of the polybasic acid anhydride (II) with the hydroxyl groups described above can be carried out at 50° to 130° C. in the presence of a polymerization inhibitor such as hydroquinone, monomethyl ether hydroquinone, and oxygen in the absence of a catalyst or in the coexistence of a reaction catalyst such as tertiary amines, tertiary phosphines, lithium chloride, quaternary ammonium salts, and quaternary phosphonium salts.

The reaction described above can provide the resin (A) having two or more (meth)acryloyl groups and at least one carboxyl group. This resin (A) can be used as it is as a photo-sensitive resin. However, in order to achieve the compatibility of the tack-free property and the alkali developability which is the object of the present invention, the difunctional epoxy resin (B) has to be further reacted with the resin (A) described above. The reaction with the difunctional epoxy resin (B) can provide a photo-sensitive resin obtained by reacting the resin (A) with the epoxy resin (B) to extend the resin (A) to a linear high molecular weight resin, and this structure is important for making it possible to exhibit the good tack-free property and alkali developability at the same time.

The photo-sensitive resin obtained in the present invention is a linear resin in which the resins (A) are combined with the resin (B).at the both sides thereof. Accordingly the resin has a high molecular weight, which results in an excellent tack-free property. And it is considered that the presence of the hydroxyl groups contained in a difunctional epoxy resin portion does not cause a reduction in the developability in alkali development disptie the high molecular weight. In this case, a tri- or higher functional epoxy resin having three or more epoxy groups in a molecule can not be used as the epoxy resin (B).

Since the tri- or higher functional epoxy resin causes gelation as the molecular weight increases and therefore does not provide the effect described above, it is unsuitable to the present invention.

Resins capable of being used as the difunctional epoxy resin (B) are known epoxy resins having two epoxy groups in a molecule and include difunctional epoxy resins selected from bisphenol type epoxy resins such as bisphenol A type epoxy resins, tetrabromobisphenol A type epoxy resins, bisphenol S type epoxy resins, and bisphenol F type epoxy resins, and alicyclic epoxy resins; diglycidyl ester type epoxy resins; diglycidyl ether type epoxy resins of polyhydric alcohols, in particular, diglycidyl ether type epoxy resins obtainable by reacting epichlorohydrin with polyalkylene glycols such as polyethylene glycol, polypropylene glycol, and polytetramethylene glycol, or with dihydric alcohols obtained by adding alkylene oxides to bisphenol compounds which are precursors of the bisphenol type epoxy resins described above; and diglycidyl amine type epoxy resins. Among the above resins, the bisphenol type epoxy resins and the diglycidyl ether type epoxy resins obtainable by reacting epichlorohydrin with polyalkylene glycols or dihydric alcohols which are adducts of alkylene oxides and bisphenol compounds can be preferably used in terms of particularly enhancing both performances of the alkali developability and the tack-free property.

The resin (A) is preferably reacted with the difunctional epoxy resin (B) so that the epoxy groups contained in the resin (B) correspond to 0.1 to 0.8 chemical equivalent per 1.0 chemical equivalent of the carboxyl groups contained in the resin (A). If the epoxy group is less than 0.1 chemical equivalent, the reaction of the resin (A) with the resin (B) is insufficiently advanced, and the photo-sensitive resin can not have a high molecular weight, so that the tack-free property is not revealed. Meanwhile, if the epoxy groups exceeding 0.8 chemical equivalent are reacted, the absolute amount of the carboxyl groups remaining in the photo-sensitive resin decreases, and the alkali development becomes impossible.

The reaction of the both can be carried out at 80° to 130° C. in the presence or absence of a diluent described later in the presence of a polymerization inhibitor such as hydroquinone, monomethyl ether hydroquinone, and oxygen and in the coexistence of a reaction catalyst such as tertiary amines, tertiary phosphines, lithium chloride, quaternary ammonium salts, and quaternary phosphonium salts.

In the present invention, the polybasic acid anhydride (II) may further be reacted with the hydroxyl groups, contained in the photo-sensitive resin obtained after the reaction of the resin (A) with the difunctional epoxy resin (B), formed by ring-opening the epoxy groups of the difunctional epoxy resin (B), or contained in the difunctional epoxy resin (B). Since carboxyl groups are further introduced into the photo-sensitive resin by a monoesterification of the polybasic acid anhydride (II), the amount of the carboxylic groups in the resin increases, which provides the effect to further enhance the alkali developability. The usable polybasic acid anhydrides (II) and the reaction conditions are the same as those described in the explanation of the production method for the resin (A).

The liquid photo-sensitive resin composition (type 1) of the present invention can be obtained by adding a photo-polymerization initiator and a diluent to the photo-sensitive resin obtainable by the method of the present invention which has so far been explained.

Further, included as well in the present invention is a liquid photo-sensitive resin composition (type 2) containing polymer fine particles having a Tg of 20° C. or lower in addition to the photo-sensitive resin, the photopolymerization initiator and the diluent. In particular, the photo-sensitive resin composition of this type 2 provides the excellent merit that it prevents a volumetric shrinkage of the coated layer and cracks even when the coated layer is exposed to high temperatures after forming patterns. The resin (A) described above, that is, the resin (A) having two or more (meth)acryloyl groups and at least one carboxyl group in a molecule can be used as it is for the photo-sensitive resin used in the composition of the type 2. As a mater of course, there may be used the photo-sensitive resin obtained by reacting the above resin (A) with the difunctional epoxy resin (B) by applying the preceding production method of the present invention.

The photo-sensitive resin composition of the type 2 is characterized in that polymer fine particles (D) are dispersed in the composition. Even if after forming patterns in the steps of irradiation with rays through development, heat curing proceeds in a pattern layer under exposure to high temperatures, the soft polymer fine particles (D) having a Tg of 20° C. or lower which are present in the pattern layer act like a cushion, so that the generation of cracks and volumetric shrinkage are retarderd, and the adhesion in the pattern layer is prevented from lowering. In this case, the Tg of a polymer constituting the polymer fine particles (D) has to be 20° C. or lower. The Tg exceeding 20° C. hardens the polymer fine particles (D) themselves, so that the effect of retarding volumetric shrinkage and the generation of cracks in the pattern layer after photo-curing is not revealed.

The "polymer fine particles" described in the present invention mean fine particles which stand in the condition that a polymer is dispersed in the liquid photo-sensitive resin composition in the form of fine particles. Islands in a sea-island structure formed by phase separation in a non-compatible system and a so-called microdomain are included as well in the "polymer fine particles" in the present invention.

The kind of the polymer constituting the polymer fine particles is not specifically restricted as long as it satisfies the Tg condition described above. The examples of the above polymer include natural rubber; synthetic rubbers such as butadiene series rubbers (polybutadiene, NBR and SBR), isoprene series rubbers (IR and butyl rubber), and chloroprene series rubbers, and vulcanizates thereof; polyorganosiloxane; and (meth)acrylate series polymers (including copolymers of (meth)acrylate with "other monomers" described later) obtaining mainly (meth)acrylate; an esterified product of (meth)acrylic acid with linear or branched aliphatic or alicyclic alcohols having 1 to 18 carbon atoms.

Further, there can be used rubbers modified with acid groups such as a carboxyl group, and poly(meth)acrylate series fine particles obtainable by copolymerizing (meth) acrylate with known unsaturated carboxylic acids such as (meth)acrylic acid, crotonic acid, maleic acid, and fumaric acid, and acid group-containing monomers such as 2-ethyl sulfonic acid (meth)acrylate, styrenesulfonic acid, and vinylsulfonic acid.

The examples of the "other monomers" for constituting the (meth)acrylate series polymer fine particles include, for example, styrene series monomers such as styrene, vinyltoluene, and α-methylstyrene, (meth)acrylamide series monomers such as (meth)acrylamide, N-monoalkyl(meth) acrylamide, and N,N-dialkyl(meth)acrylamide, hydroxyl group-containing (meth)acrylate series monomers such as monoester of (meth)acrylic acid with polypropylene glycol or polyethylene glycol, vinyl acetate, and (meth) acrylonitrile. All of these monomers are used by adjusting the Tg of a polymer constituting the fine particles to 20° C. or lower.

The polymer fine particles (D) according to the present invention has preferably a cross-linking structure. The polymer fine particles (D) are liable to adhere to each other and coagulate because of the relatively low Tg, but the introduction of the crosslinking structure makes it easy to handle them and is effective for enhancing the moisture resistance and the chemical resistance of the photo-cured layer. Further, in the polymer fine particles into which the cross-linking structure is not introduced, the cushion effect thereof after photo-curing is damaged in some cases if they are swollen by a diluent contained in the liquid photo-sensitive resin composition, but the introduction of the cross-linking structure can prevent this swelling.

In case of the (meth)acrylate series polymer fine particles, in order to introduce the cross-linking structure, there can be employed a method in which copolymerized are multifunctional monomers such as multifunctional (meth)acrylate which is esterified product of a polyhydroxy compound such as glycol with two or more (meth)acrylic acids, allyl (meth) acrylate, divinylbenzene, and diallyl phthalate, and copolymerized are monomers having a reactivity to acid groups, such as epoxy group-containing monomers such as glycidyl (meth)acrylate, aziridinyl group-containing monomers such as (meth)acryloyl aziridine and (meth)acryloyloxyethyl aziridine, and oxazolinyl group-containing monomers such as 2-isopropenyl-2-oxazoline, to thereby cause a cross-linking reaction with the acid groups contained in the polymer fine particles.

These monomers for introducing the cross-linking structure can be copolymerized in a proportion of 10 weight % or less based on the whole monomer components for the polymer fine particles. It is an essential requisite that the polymer fine particles according to the present invention have a Tg of 20° C. or lower. The fine particles having too minute cross-linking structure have a Tg exceeding 20° C. or do not substantially exhibit the Tg, and in addition, the effects of preventing cracks and volumetric shrinkage are not revealed. Accordingly, the fine particles described above are not preferred.

A production method for the polymer fine particles is not specifically restricted, and an emulsion polymerization is recommendable because of easiness to obtain a fine particulate polymer. The emulsion polymerization is not specifically restricted, and there can be employed all of a batch mixing polymerization, a monomer dropping method, a pre-emulsion method, a seed polymerization, and a multi-stage (core-shell) polymerization. When (meth)acrylate series polymers are produced by the emulsion polymerization, known emulsifiers may be used, and the polymer type emulsifiers disclosed in Japanese Patent Application Laid-Open No. 5-25366 can be used as well. These polymer type emulsifiers are water soluble or water dispersible, terminal alkyl group-containing polymers having an acid value of 200 or more, polymerizing unsaturated carboxylic acid such as (meth)acrylic acid, crotonic acid, maleic acid, and fumaric acid, and alkylmercaptan having 6 to 18 carbon atoms as main components, or the salts thereof. In addition to unsaturated carboxylic acid and alkylmercaptan, there can be employed (meth)acrylate series monomers, styrene series monomers, and (meth)acrylamide series monomers, which have been given as the examples of monomers capable of being used for constituting the polymer fine particles, and it is preferred in terms of the emulsification ability to suitably control the amount of the alkylmercaptan to adjust the molecular weight to 300 to 7000.

In using these emulsifiers, if monomers which are reactive to unsaturated carboxylic acids constituting the emulsifier are used for a part of the polymer fine particle-constituting monomers, adverse effects (reduction in moisture resistance and chemical resistance in a resist layer) exerted by the emulsifier can be prevented. The examples of the above monomers include the preceding monomers having a reactivity to acid groups, that is, epoxy group-containing monomers such as glycidyl (meth)acrylate, aziridinyl group-containing monomers such as (meth)acryloyl aziridine and (meth)acryloyloxyethyl aziridine, and oxazolinyl group-containing monomers such as 2-isopropenyl-2-oxazoline.

The polymer fine particles (D) have an average particle diameter controlled preferably to 0.1 to 100 μm. The diameter smaller than 0.1 μm does not reveal the filling effect, while the large diameter exceeding 100 μm reduces the accuracy of resist patterns, and therefore both are not preferred.

The amount of the polymer fine particles (D) contained in the liquid photo-sensitive resin composition falls preferably in a range of 1to 50 weight parts per 100 weight parts of the photo-sensitive resin. The amount less than 1 weight part does not provide the prevention effect of crack formation and volumetric shrinkage which are caused in a heating process after forming a pattern layer. Meanwhile, the amount larger than 50 weight parts deteriorates the characteristics such as alkali developability, resolution and a heat resistance of the pattern layer, and therefore it is not preferred.

A method for adding the polymer fine particles (D) to the liquid photo-sensitive resin composition is not specifically restricted. Recommendable is a method in which the photo-sensitive resin or the epoxy resin which is the starting material therefor, and a diluent described later are mixed, and an emulsion of the polymer fine particles (D) is added directly thereto, followed by removing water under atmospheric pressure or reduced pressure. A diluent capable of forming an azeotrope with water may be used.

The following photopolymerization initiators and diluents can be used for either of the liquid photo-sensitive resin composition of the type 1 using the photo-sensitive resin obtainable by reacting the resin (A) with the difunctional epoxy resin (B), and the liquid photo-sensitive resin composition of the type 2 containing the polymer fine particles having a Tg of 20° C. or lower as well as the photo-sensitive resin.

Known compounds can be used as the photopolymerization initiator. The examples thereof include benzoin and alkyl ethers thereof such as benzoin, benzoin methyl ether, and benzoin ethyl ether; acetophenones such as acetophenone, 2,2-dimethoxy-2-phenylacetophenone, 1,1-dichloroacetophenone, and 4-(1-t-butyl-dioxy-1-methylethyl)acetophenone; anthraquinones such as 2-methylanthraquinone, 2-amylanthraquinone, 2-t-butylanthraquinone, and 1-chloroanthraquinone; thioxanthones such as 2,4-dimethylthioxanthone, 2,4-diisopropylthioxanthone, and 2-chlorothioxanthone; ketals such as acetophenone-dimethylketal and benzyldimethylketal; benzophenones such as benzophenone, 4-(1-t-butyldioxy-1-methylethyl)benzophenone and 3,3',4,4'-tetrakis(t-butyldioxycarbonyl)benzophenone; 2-methyl-1-[4-(methlthio)phenyl]-2-morpholino-propane-1-one and 2-benzyl-2-dimethylaeino-1- (4-morpholinophenyl)-butanone-1; acyl phosphine oxides and xanthones.

These photopolymerization initiators are used singly or as the mixture of two or more kinds and contained preferably in an amount of 0.5 to 30 weight parts per 100 weight parts of the photo-sensitive resin. If the amount of the photopolymerization initiator Is smaller than 0.5 weight part, the light irradiation time has to be increased, and the photopolymerization is hard to start even by irradiating with rays, which results in obtaining no suitable surface hardness. Meanwhile, the a mount of the photopolymerization initiator exceeding 30 weight parts provides no merit of using it i n large quantities.

Solvents or diluent monomers capable of taking part in the photopolymerization react ion can be used as the diluent singly or in the mixture of two or more kinds. The diluent is blended preferably in an amount of 5 to 500 weight parts per 100 weight parts of the photo-sensitive resin so that the optimum viscosity in each applying method can be obtained. In particular, when the diluent monomers are used as the diluent singly or in the mixture, the diluent monomers are blended preferably in an amount of 5 to 100 weight parts per 100 weight parts of the photo-sensitive resin in terms of the physical properties.

The examples of the solvent include hydrocarbons such as toluene and xylene; cellosolves such as cellosolve and butylcellosolve; carbitols such as carbitol and butylcarbitol; esters such as cellosolve acetate and carbitol acetate; ketones such as methyl isobutyl ketone and methyl ethyl ketone; and ethers such as diethylene glycol dimethyl ether. The examples of the diluent monomer include diethylene glycol di(meth)acrylate, propylene glycol di(meth)acrylate, β-hydroxyethyl(meth)acrylate, (2-oxo-1,3-dioxolane-4-yl)-methyl(meth)acrylate, trimethylolpropane tri(meth)acrylate, trimethylolpropane di(meth)acrylate, pentaerythritol tetra (meth)acrylate, dipentaerythritol hexa(meth)acrylate, and tris(hydroxyethyl)isocyanurate tri(meth)acrylate.

There can be added to the liquid photo-sensitive resin compositions (type 1 and type 2) according to necessity, fillers such as talc, clay and barium sulfate, color pigments, defoaming agents, coupling agents, leveling agents, epoxy resins such as novolak type epoxy resins, bisphenol A type epoxy resins, bisphenol F type epoxy resins, alicyclic epoxy resins, and triglycidyl isocyanurate, and epoxy curing agents such as dicyandiamide and imidazole compounds.

Since in the liquid photo-sensitive resin compositions (type 1 and type 2) of the present invention, the parts which are not irradiated with light are dissolved in an alkaline aqueous solution, alkali development can be carried out. Alkali which can be used for the development includes, for example, alkaline metal compounds such as sodium carbonate, potassium carbonate, sodium hydroxide, and potassium hydroxide; alkaline earth metal compounds such as calcium hydroxide; ammonia; and water soluble organic amines such as monomethylamine, dimethylamine, trimethylamine, monoethylamine, diethylamine, triethylamine, monopropylamine, dimethylpropylamine, monoethanolamine, diethanolamine, triethanolamine, ethylenediamine, diethylenetriamine, dimethylaminoethyl methacrylate, and polyethylenimine. They can be used singly or in the mixture of two or more kinds.

EXAMPLES

The present invention shall be explained below in further detail with reference to examples. However, the following examples shall not restrict the present invention, and the matters modified and enforced within a range in which they do not deviate from the subjects which have been described above or shall be described later shall be included entirely in the technical scope of the present invention. Part and percentage in the examples are based on weight unless otherwise described.

Synthetic Example 1

Ethylcarbitol acetate of 337 parts and toluene of 337 parts were added to a cresol novolak type epoxy resin ESCN-195 XL (epoxy equivalent: 195, manufactured by Sumitomo Chemical Ind. Co., Ltd.) of 1000 parts, and they were dissolved by heating. Then, acrylic acid of 369 parts, triphenylphosphine of 4.1 parts, and methylhydroquinone of 1.1 part were added, and the reaction was carried out at 110° C. for 12 hours. This reaction product was cooled down to 100° C., and then tetrahydrophthalic anhydride of 467 parts, ethylcarbitol acetate of 115 parts, and toluene of 115 parts were added and reacted for 5 hours, whereby a resin mixture (R-1) with ethylcarbitol acetate and toluene containing the resin with an acid value of 97 in a proportion of 67% was obtained.

Synthetic Example 2

Ethylcarbitol acetate of 349 parts and toluene of 349 parts were added to a cresol novolak type epoxy resin YDCN-703S (epoxy equivalent: 200, manufactured by Toto Kasei Co., Ltd.) of 1000 p arts, and they were dissolved by heating. Then, acrylic acid of 333 parts, p-nonylphenol of 83 p art s as alkylphenol, triethylammoniumi bromide of 4.2 parts, and methylhydroquinone of 1.2 part were added, and the reaction was carried out at 110° C. for 14 hours. This reaction product was cooled down to 100° C.), and then tetrahydrophthalic anhydride of 456 parts, ethylcarbitol acetate of 112 parts, and toluene of 112 parts were added and reacted for 4 hours, whereby a resin mixture (R-2) with ethylcarbitol acetate and toluene containing the resin with an acid value of 93 in a proportion of 67% was obtained.

Synthetic Example 3

A bisphenol A type epoxy resin Araldite GY-250 (epoxy equivalent: 185, manufactured by Ciba Geigy Co., Ltd.) of 2.1 parts was added to the resin mixture (R-1) of 100 parts obtained in Synthetic Example 1, and the reaction was carried out at 110° C. for 4 hours, whereby a resin mixture (R-3) with ethylcarbitol acetate and toluene containing the resin with an acid value of 84 in a proportion of 64.5 % was obtained.

Synthetic Example 4

A bisphenol A type epoxy resin YD-014 (epoxy equivalent: 954, manufactured by Toto Kasei Co., Ltd.) of 5.4 parts was added to the resin mixture (R-1) of 100 parts obtained in Synthetic Example 1, and the reaction was carried out at 110° C. for 5 hours, whereby a resin mixture (R-4) with ethylcarbitol acetate and toluene containing the resin with an acid value of 85 in a proportion of 68.5% was obtained.

Synthetic Example 5

A bisphenol A type epoxy resin YD-017 (epoxy equivalent: 1820, manufactured by Toto Kasei Co., Ltd.) of 10.2 parts was added to the resin mixture (R-1) of 100 parts obtained in Synthetic Example 1, and the reaction was carried out at 110° C. for 5 hours, whereby a resin mixture (R-5) with ethylcarbitol acetate and toluene containing the resin with an acid value of 79 in a proportion of 70.0 % was obtained.

Synthetic Example 6

A bisphenol F type epoxy resin YDF-8170 (epoxy equivalent: 162, manufactured by Toto Kasei Co., Ltd.) of 1.7 part was added to the resin mixture (R-2) of 100 parts obtained in Synthetic Example 2, and the reaction was carried out at 110° C. for 4.5 hours, whereby a resin mixture (R-6) with ethylcarbitol acetate and toluene containing the resin with an acid value of 82 in a proportion of 67.4 % was obtained.

Synthetic Example 7

The bisphenol A type epoxy resin YD-017 (epoxy equivalent: 1820, manufactured by Toto Kasei Co., Ltd.) of 9.8 parts was added to the resin mixture (R-2) of 100 parts obtained in Synthetic Example 2, and the reaction was carried out at 110° C. for 6 hours, whereby a resin mixture (R-7) with ethylcarbitol acetate and toluene containing the resin with an acid value of 78 in a proportion of 69.8% was obtained.

Synthetic Example 8

A polypropylene glycol diglycidyl ether type epoxy resin PG-207 (epoxy equivalent: 310, manufactured by Toto Kasei Co., Ltd.) of 3.3 parts was added to the resin mixture (R-2) of 100 parts obtained in Synthetic Example 2, and the reaction was carried out at 110° C. for 5 hours, whereby a resin mixture (R-8) with ethylcarbitol acetate and toluene containing the resin with an acid value of 81 in a proportion of 68.1% was obtained.

Synthetic Example 9

Adeka Resin EP-4000 (epoxy equivalent: 325, manufactured by Asahi Denka Co., Ltd.) of 3.5 parts was added to the resin mixture (R-2) of 100 parts obtained in Synthetic Example 2, and the reaction was carried out at 110° C. for 4.5 hours, whereby a resin mixture (R-9) with ethylcarbitol acetate and toluene containing the resin with an acid value of 79 in a proportion of 68.1% was obtained.

Examples 1 to 7 and Comparative Examples 1 to 3

The resin mixtures (R-1) to (R-9) obtained in Synthetic Examples 1 to 9 were kneaded with the blend components shown in Table 1 to thereby obtain the photo-sensitive resin compositions. The results obtained by evaluating the above resin composition by the following methods are shown in Table 2.

[Evaluation of developability]

The photo-sensitive resin composition was applied on a degreased and washed, copper-clad laminate having a thickness of 1.6 mm in a thickness of 20 to 30 μm and dried at 80° C. for prescribed time (30, 40, 50, and 60 minutes) in a hot air-circulating type heating oven to thereby obtain a coated layer. Then, development was carried out in a 1% Na$_2$CO$_3$ aqueous solution at 30° C. for 80 seconds under a pressure of 2.1 kg/cm$^2$, and then a residual resin was visually observed for evaluation.

○: Good developability—no resist remains at all on the copper face.

Δ: A little inferior developability—a little resist remains on the copper face.

X: Inferior developability—resist remains considerably on the copper face.

[Evaluation of tack-free property]

The photo-sensitive resin composition was applied on a degreased and washed, copper-clad laminate having a thickness of 1.6 mm in a thickness of 20 to 30 μm and dried at 80° C. for 30 minutes in the hot air-circulating type heating oven to thereby obtain a coated layer. Then, a polyester film was superposed on the coated layer face and interposed between silicone sheets, followed by compressing it at 50° C. for 30 minutes. This sample was adjusted to a temperature of 25° C., and then the polyester film was peeled off to evaluate a peeling situation based on the following criteria:

○: The coated layer is not tacky.

Δ: The coated layer is slight tacky.

X: The coated layer is tacky.

[Evaluation of adhesion]

A coated layer was formed in the same manner as that in the evaluation of the tack-free property and irradiated with a luminous energy of 500 mJ/cm$^2$ by means of an extra-high pressure mercury lamp of 1 Kw. Then, after heating the coated layer at 150° C. for 30 minutes, 100 cross-cuts of 1 mm×1 mm were cut thereon according to a test method of JIS D-0202, and the peeling condition after carrying out a peeling test with an adhesive tape was visually observed for evaluation.

○: No change at 100/100.

Δ: 80/100 to 99/100.

X: 0/100 to 79/100.

[Heat resistance to solder]

The coated layer after exposure was immersed in a solder bath of 260° C. for 20 seconds according to a test method of JIS D-0202, and the condition of the coated layer after immersing was observed for evaluation.

○: No change in the appearance of the coated layer.

X: Swelling, melting or removing observed in the appearance of the coated layer.

[Electroless gold plating resistance]

The coated layer after exposure was gold-plated at a current density of 1 A/dm$^2$ for 15 minutes in "Autoronecx CI" (gold-plating solution manufactured by Cel-Rex Corp., U.S.A.) to deposit gold in a thickness of 2 μm. Then, a peeling test of the coated layer was carried out with an adhesive tape. Peeling was evaluated based on the following criteria:

○: No change in the coated layer.

Δ: Slight peeling observed.

X: Peeling observed in 20% or more of the whole coated layer.

TABLE 1

|  | Example | | | | | Comparative Example | | |
|---|---|---|---|---|---|---|---|---|
|  | 1 | 2 | 3 | 4 | 5 | 1 | 2 | 3 |
| Resin mixture (90 wight parts) | R-3 | R-4 | R-5 | R-6 | R-7 | R-1 | R-2 | R-1 |
| Diluent: polyfunctional monomer Pentaerythritol tetraacrylate | 10 | 10 | 10 | 10 | 10 | 10 | 10 | 10 |
| Diluent: solvent Ethylcarbitol acetate | 20 | 20 | 20 | 20 | 20 | 20 | 20 | 20 |
| Photopolymerization initiator: Irugacure 907[1] | 8 | 8 | 8 | 8 | 8 | 8 | 8 | 8 |
| Epoxy resin: EPN-1138[2] | 20 | 20 | 20 | 20 | 20 | 20 | 20 | 0 |
| Epoxy resin: Araldite GY-250[3] | 0 | 0 | 0 | 0 | 0 | 0 | 0 | 20 |
| Epoxy curing agent: dicyandiamide | 2 | 2 | 2 | 2 | 2 | 2 | 2 | 2 |
| Filler: barium sulfate | 30 | 30 | 30 | 30 | 30 | 30 | 30 | 30 |
| Defoaming agent: Floren AC300[4] | 1.2 | 1.2 | 1.2 | 1.2 | 1.2 | 1.2 | 1.2 | 1.2 |
| Pigment: phthalocyanine green | 0.6 | 0.6 | 0.6 | 0.6 | 0.6 | 0.6 | 0.6 | 0.6 |

(Values shown in TABLE are based on weight parts)
[1]Photopolymerization initiator manufactured by Ciba Geigy Co., Ltd.
[2]Phenol novolak type epoxy resin manufactured by Ciba Geigy Co., Ltd.
[3]Bisphenol type epoxy resin manufactured by Ciba Geigy Co., Ltd.
[4]Defoaming agent manufactured by Kyoeisha Oil & Fat Chemical Co., Ltd.

TABLE 2

|  | Example | | | | | Comparative Example | | |
|---|---|---|---|---|---|---|---|---|
|  | 1 | 2 | 3 | 4 | 5 | 1 | 2 | 3 |
| Evaluation of developability Drying time at 80° C. | | | | | | | | |
| 30 (minutes) | ○ | ○ | ○ | ○ | ○ | ○ | ○ | ○ |
| 40 | ○ | ○ | ○ | ○ | ○ | ○ | ○ | ○ |
| 50 | ○ | ○ | ○ | ○ | ○ | ○ | ○ | ○ |
| 60 | ○ | ○ | Δ | ○ | Δ | X | Δ | Δ |
| Tack-free property | ○ | ○ | ○ | ○ | ○ | X | Δ | X |
| Adhesion | ○ | ○ | ○ | ○ | ○ | Δ | ○ | Δ |
| Solder heat resistance | ○ | ○ | ○ | ○ | ○ | ○ | ○ | ○ |

TABLE 2-continued

|  | Example | | | | | Comparative Example | | |
|---|---|---|---|---|---|---|---|---|
|  | 1 | 2 | 3 | 4 | 5 | 1 | 2 | 3 |
| Electroless gold plating resistance | ○ | ○ | ○ | ○ | ○ | X | ○ | X |

In the comparative examples using the resins (R-1) and (R-2) which had not been extended into high molecular weight with the difunctional epoxy resins, not only the developability after heating for a long time of 60 minutes was deteriorated, but also the tack-free property was inferior as well. However, in Comparative Example 2 employing alkylphenol, the gold plating resistance and the adhesion were good as compared with those of Comparative Example 1. Since the difunctional epoxy resin (GY-250), which had been used for reacting with the resin in Example 1, was merely kneaded in Comparative Example 3, the developability and the tack-free property were deteriorated, and the adhesion and the gold plating resistance were inferior as well. In all of Examples 1 to 7, the good developability and tack-free property are shown, and it is obvious that both the performances are compatible.

Synthetic Example 10

A bisphenol A type epoxy resin GY-250 (epoxy equivalent: 185, manufactured by Ciba Geigy Co., Ltd.) of 1000 parts was heated at 110° C., and then acrylic acid of 389 parts, triethylammonium bromide of 7.0 parts, and methylhydroquinone of 1.4 part were added to carry out the reaction for 10 hours. This reaction product was cooled down to 100° C., and then tetrahydrophthalic anhydride of 822 parts, ethylcarbitol acetate of 544 parts, and toluene of 544 parts were added and reacted for 6 hours, whereby a resin mixture (A) was obtained. The bisphenol A type epoxy resin GY-250 of 15.1 parts, ethylcarbitol acetate of 3.7 parts, and toluene of 3.7 parts were added to this resin mixture (A) of 100 parts, and they were reacted at 110° C. for 14 hours, whereby a resin mixture (R-10) with ethylcarbitol acetate and toluene containing the resin with an acid value of 61 in a proportion of 67% was obtained.

Synthetic Example 11

The bisphenol A type epoxy resin GY-250 of 17.2 parts, ethylcarbitol acetate of 6.2 parts, and toluene of 6.2 parts were added to the resin mixture (A) of 100 parts obtained in Synthetic Example 10, and they were reacted at 110° C. for 15 hours. This reaction product was cooled down to 100° C., and then tetrahydrophthalic anhydride of 7.4 parts, ethylcarbitol acetate of 2.0 parts, and toluene of 2.0 parts were added and reacted for 4 hours, whereby a resin mixture (R-11) with ethylcarbitol acetate and toluene containing a resin with an acid value of 83 in a proportion of 65% was obtained.

Synthetic Example 12

Butylcellosolve acetate of 61 parts was added to a bisphenol S type epoxy resin EX-251 (epoxy equivalent: 198, manufactured by Nagase Kasei Ind. Co., Ltd.) of 100 parts, and they were dissolved by heating. Then, acrylic acid of 36 parts, triphenylphosphine of 0.41 part, and methylhydroquinone of 0.11 part were added, and the reaction was carried out at 110° C. for 14 hours. This reaction product was cooled down to 100° C., and then succinic anhydride of 51 parts and butylcellosolve acetate of 23 parts were added, and they were reacted for 8 hours. The bisphenol S type epoxy resin EX-251 of 40 parts and butylcellosolve acetate of 18 parts were added to this resin mixture, and they were reacted at 110° C. for 14 hours, whereby a resin mixture (R-12) with butylcellosolve acetate containing the resin with an acid value of 78 in a proportion of 69% was obtained.

Synthetic Example 13

The bisphenol A type epoxy resin GY-250 (epoxy equivalent: 185, manufactured by Ciba Geigy Co., Ltd.) of 100 parts was heated at 110° C., and then acrylic acid of 39 parts, triethylammonium bromide of 0.67 part, and methylhydroquinone of 0.14 part were added to carry out the reaction for 10 hours. This reaction product was cooled down to 100° C., and then tetrahydrophthalic anhydride of 33 parts, ethylcarbitol acetate of 29 parts, and toluene of 29 parts were added and reacted for 5 hours, whereby a resin mixture (R-13) with ethylcarbitol acetate and toluene containing the resin with an acid value of 72 in a proportion of 75% was obtained.

Synthetic Example 14

Butylcellosolve acetate of 59 parts was added to the bisphenol S type epoxy resin EX-251 (epoxy equivalent: 198, manufactured by Nagase Kasel Ind. Co., Ltd.) of 100 parts, and they were dissolved by heating. Then, acrylic acid of 36 parts, triphenylphosphine of 0.41 part, and methylhydroquinone of 0.14 part were added, and the reaction was carried out at 110° C. for 14 hours. This reaction product was cooled down to 100° C., and then succinic anhydride of 28 parts and butylcellosolve acetate of 12 parts were added, followed by reacting them for 6 hours. A resin mixture (R-14) with butylcellosolve acetate containing the resin with an acid value of 97 in a proportion of 70% was obtained.

Examples 8 to 11 and Comparative Examples 4 to 6

The resin mixtures (R-10) to (R-14) obtained in Synthetic Examples 10 to 14 were kneaded with the blend components shown in Table 3 to obtain the photo-sensitive color resin composition for a color filter. This color resin composition was spin-coated on a glass plate and then dried at 80° C. for 30 minutes to form a coated layer having a thickness of about 1 μm. The results obtained by evaluating the coated layer thus formed are shown in Table 3.

[Drying property of the coated layer]

A negative film was compressed on the coated layer, and a condition in peeling it was observed and evaluated based on the following criteria:

○: No sounds are produced in peeling, and the negative film can cleanly be peeled off.

Δ: Peeling sound is produced in peeling.

X: The coated layer is adhered on the negative film.

[Exposure sensitivity]

A Stouffer 21 steps step tablet was contacted tightly on the coated layer and was irradiated with a luminous energy of 500 mJ/cm$^2$ by means of an extra-high pressure mercury lamp of 1 Kw. Then, development was carried out in a 1% Na$_2$CO$_3$ aqueous solution for 30 seconds under a pressure of 2.1 kg/cm$^2$, and then the step number of the step tablet remaining on the glass plate was determined.

[Resolution]

The coated layer was irradiated with a luminous energy of 500 mJ/cm$^2$ via a line and space mask of 10 μm by means of an extra-high pressure mercury lamp of 1 Kw, and development was carried out in the same manner as that in measuring the exposure sensitivity. The resolution was evaluated based on the following criteria:

○: No change in the patterns.

Δ: A part of the patters broken.

X: Almost no patterns remaining.

[Heat resistance]

The coated layer was exposed in the same manner as that in measuring the exposure sensitivity. Then, the exposed coated layer was heated at 150° C. for 30 minutes to fix the patterns, and the film was then further heated at 250° C. for one hour. Discoloring and fading were evaluated.

○: No discoloring and fading observed.

X: Discoloring and fading observed.

TABLE 3

|  | Example | | | | Comparative Example | | |
| --- | --- | --- | --- | --- | --- | --- | --- |
|  | 8 | 9 | 10 | 11 | 4 | 5 | 6 |
| Resin mixture (20 weight parts) | R-3 | R-10 | R-11 | R-12 | R-1 | R-13 | R-14 |
| Diluent: solvent Ethylcarbitol acetate | 25 | 25 | 25 | 35 | 25 | 20 | 35 |
| Photopolymerization initiator: Irugacure 907[1] | 1.0 | 1.0 | 1.0 | 1.0 | 1.0 | 1.0 | 1.0 |
| Pigment: |  |  |  |  |  |  |  |
| Perylene red | 6.3 | 5.7 | — | — | 6.5 | — | — |
| Phthalocyanine blue | — | — | 4.5 | — | — | 5.0 | — |
| Phthalocyanine green | — | — | — | 6.0 | — | — | 5.7 |
| Polyfunctional monomer: Dipentaerythritol hexaacrylate | 3 | 3 | 3 | 3 | 3 | 3 | 3 |
| Epoxy resin: EPN-1138[2] | 5 | 4 | 4 | 5 | 5 | 5 | 5.6 |
| Epoxy curing agent: dicyandiamide | 0.35 | 0.35 | 0.35 | 0.40 | 0.40 | 0.40 | 0.40 |
| Coupling agent: A-174[3] | 0.15 | 0.15 | 0.15 | 0.15 | 0.15 | 0.15 | 0.15 |
| Drying property of film | ○ | ○ | ○ | ○ | Δ | X | X |
| Exposure sensitivity | 10 | 10 | 8 | 10 | 11 | 8 | 10 |
| Resolution | ○ | ○ | ○ | ○ | Δ | X | Δ |
| Heat resistance | ○ | ○ | ○ | ○ | ○ | ○ | ○ |

(Values shown in TABLE excluding the exposure sensitivity are based on weight parts)
[1] Photopolymerization initiator manufactured by Ciba Geigy Co., Ltd.
[2] Phenol novolak type epoxy resin manufactured by Ciba Geigy Co., Ltd.
[3] Silane coupling agent manufactured by Japan Unicar Co., Ltd.

Synthetic Example 15

<Synthesis of (meth)acrylate series polymer fine particles [1]>

A flask equipped with a stirrer, a reflux condenser, a nitrogen-introducing tube, a thermometer, and a dropping funnel was charged with isopropyl alcohol of 180 parts, and the temperature was elevated up to 81° C. while introducing a nitrogen gas to carry out refluxing for 10 minutes. The mixture of acrylic acid of 53.6 parts, lauryl methacrylate of 16.5 parts, Blenmer PE-200 (polyethylene glycol monomethacrylate, manufactured by Nippon Oil & Fat Co., Ltd.) of 91 parts, n-dodecylmercaptan of 13.7 parts, and 2,2'-azobisisobutylonitrile of 0.4 part was added dropwise to this flask over the period of 2 hours. After finishing dropping, the polymer solution was aged for one hour while further refluxing to thereby obtain a solution of a polymer emulsifier S-1 having a non-volatile content of 49.1%

Next, another flask equipped with a stirrer, a reflux condenser, a nitrogen-introducing tube, a thermometer, and a dropping funnel was charged with ion-exchanged water of 63 parts, and the temperature was raised up to 70° C. while introducing a nitrogen gas. Then, ethyl acrylate of 85 parts, methyl methacrylate of 10 parts, glycidyl methacrylate of 5 parts, the polymer emulsifier S-1 solution of 4.1 parts, 28% aqueous ammonia of 0.5 part, and ion-exchanged water of 36 parts were mixed and stirred well to prepare a completely emulsified pre-emulsion, which was charged into the dropping funnel with which the flask described above was equipped.

The flask was charged with a 5% aqueous solution 8 parts of an ammonia-neutralized salt of 4,4'-azobis(4-cyanopentanoic acid), and then the pre-emulsion described above was dropped from the dropping funnel over the period of 3.5 hours. The temperature was kept at 70° to 75° C. while dropping. After finishing the dropping, the pre-emulsion remaining in the funnel was washed down with ion-exchanged water of 10 parts, and the washing was put in the flask. Stirring was further continued for 2 hours to finish the polymerization, whereby an emulsion of (meth)acrylate series polymer fine particles [1] having a non-volatile content of 46.0% was obtained. A part of the emulsion was taken to vaporize water, and a Tg of the polymer was determined with a differential scanning type calorimeter to find that it was −8° C.

<Production of ink compositions for a solder resist>

Ethylcarbitol acetate of 80 parts was added to a cresol novolak type epoxy resin YDCN-703 (epoxy equivalent: 200, manufactured by Toto Kasei Co., Ltd.) of 100 parts, and they were dissolved by heating at 120° C. while stirring. After the solution was cooled down to 60° C., the emulsion 43.48 parts of the polymer fine particles [1] described above was added, and the temperature was raised up to 130° C. while stirring to remove water completely. Then, acrylic acid of 36.9 parts, chromic chloride 6 hydrates of 0.14 part, and methylhydroquinone of 0.11 part were added, and they were reacted at 110° C. for 3 hours. An acid value of the reaction product became 3.0, and the introduction of acryloyl groups was confirmed. Next, tetrahydrophthalic anhydride of 45.6 parts, ethylcarbitol acetate of 29 parts, and lithium chloride anhydrous of 0.14 part were added, and they were reacted at 100° C. for 3 hours, whereby a mixture composition (C-1) with ethylcarbitol acetate containing the polymer fine particles [1] and a photo-curable resin having an acid value of 90 in a proportion of 65% was obtained.

Synthetic Example 16

Ethylcarbitol acetate of 80 parts was added to the same epoxy resin of 100 parts as that used in Synthetic Example 15, and they were dissolved by heating at 120° C. while stirring. Then, acrylic acid of 36.9 parts; chromic chloride 6 hydrates of 0.14 part, and methylhydroquinone of 0.11 part were added, and they were reacted at 110° C. for 3 hours. An acid value of the reaction product became 3.3, and the Introduction of acryloyl groups was confirmed. After the solution was cooled down to 60° C., the emulsion 43.48 parts of the polymer fine particles [1] synthesized in Example 1 was added, and the temperature was raised up to 115° C. while stirring to remove water completely.

Next, tetrahydrophthalic anhydride of 45.6 parts, ethylcarbitol acetate of 29 parts, and lithium chloride anhydrous of 0.14 part were added, and they were reacted at 100° C. for 3 hours,. whereby a mixture composition (C-2) with ethylcarbitol acetate containing the polymer fine particles [1] and a photo-curable resin having an acid value of 90 in a proportion of 65% was obtained.

Synthetic Example 17

Ethylcarbitol acetate of 80 parts was added to the same epoxy resin of 100 parts as that used in Synthetic Example 15, and they were dissolved by heating at 120° C. while stirring Then, acrylic acid of 36.9 parts, chromic chloride 6 hydrates of 0.14 part, and methylhydroquinone of 0.11 part were added, and they were reacted at 110° C. for 3 hours. An acid value of the reaction product became 3.3, and the introduction of acryloyl groups was confirmed. Next, tetrahydrophthalic anhydride of 45.6 parts, ethylcarbitol acetate of 29 parts, and lithium chloride anhydrous of 0.14 part were added, and they were reacted at 100° C. for 3 hours. After the solution was cooled down to 60° C., the emulsion 43.48 parts of the polymer fine.particles [1] synthesized in Example 1 was added, and the temperature was raised up to 115° C. while stirring to remove water completely, whereby a mixture composition (C-3) with ethylcarbitol acetate containing the polymer fine particles [1] and a photo-curable resin having an acid value of 91 in a proportion of 65% was obtained.

Synthetic Example 18

<Syntheis of (meth)acrylate. series polymer fine particles [21]>

The emulsion polymerization was carried out in the same manner as that in Synthetic Example 15 to obtain an emulsion of (meth)acrylate series polymer fine particles [2] having a non-volatile content of 46.5%, except that in the synthetic process of the polymer fine particles in Example 1, Hitenol N08 (ammonium alkylphenyl polyethylene oxide sulfonate, manufactured by Daiichi Kogyo Seiyaku Co., Ltd.) was substituted for the polymer emulsifier S-1. A part of the emulsion was taken to vaporize water, and the Tg of the polymer was determined with a differential scanning type calorimeter to find that it was –10° C.

Ethylcarbitol acetate of 80 parts was added to the same epoxy resin of 100 parts as that used in Synthetic Example 15, and they were dissolved by heating at 120° C. while stirring. After the solution was cooled down to 60° C., the emulsion 43.01 parts of the polymer fine particles [2] described above was added, and the temperature was raised up to 130° C. while stirring to remove water completely.

Then, acrylic acid of 36.9 parts, chromic chloride 6 hydrates of 0.14 part, and methylhydroquinone of 0.11 part were added, and they were reacted at 110° C. for 3 hours. An acid value of the reaction product became 3.0, and the introduction of acryloyl groups was confirmed. Next, tetrahydrophthalic anhydride of 45.6 parts, ethylcarbitol acetate of 29 parts, and lithium chloride anhydrous of 0.14 part were added, and they were reacted at 100° C. for 3 hours, whereby a mixture composition (C-4) with ethylcarbitol acetate containing the polymer fine particles [2] and a photo-curable resin having an acid value of 89 in a proportion of 65% was obtained.

Synthetic Example 19

Ethylcarbitol acetate of 80 parts was added to a bisphenol A type epoxy resin GY-250 (epoxy equivalent: 185, manufactured by Ciba Geigy Co., Ltd.) of 100 parts, and the temperature was elevated up to 60 ° C. while stirring to prepare a homogeneous solution. An emulsion 43.48 parts of the polymer fine particles [1] synthesized in Synthetic Example 15 was added, and then the temperature was raised up to 130 ° C. to remove water completely. Then, acrylic acid of 38.9 parts, chromic chloride 6 hydrates of 0.14 part, and methylhydroquinone of 0.12 part were added, and they were reacted at 110° C. for 3 hours.

This reaction product was cooled down to 100° C., and then tetrahydrophthalic anhydride of 82.2 parts and lithium chloride anhydrous of 0.14 part were added, followed by reacting them at 100° C. for 10 hours. The epoxy resin GY-250 of 50 parts was added, and the reaction was continued at 110° C. for 5 hours. Further, tetrahydrophthalic anhydride of 39.6 parts and ethylcarbitol acetate of 98.1 parts were added, and they were reacted at 100° C. for 3 hours, whereby a mixture composition (C-5) with ethylcarbitol acetate containing the polymer fine particles [1] and a photo-curable resin having an acid value of 93 in a proportion of 65% was obtained.

Synthetic Example 20 (comparative example)

Ethylcarbitol acetate of 80 parts was added to the same epoxy resin of 100 parts (the cresol novolak type epoxy resin YDCN-703) as that used in Synthetic Example 15, and they were dissolved by heating at 120° C. while stirring. Then, acrylic acid of 36.9 parts, chromic chloride 6 hydrates of 0.14 part, and methylhydroquinone of 0.11 part were added, and they were reacted at 110° C. for 3 hours. It was confirmed that an acid value of the reaction product became 3.3. Next, tetrahydrophthalic anhydride of 45.6 parts, ethylcarbitol acetate of 18.3 parts, and lithium chloride anhydrous of 0.14 part were added, and they were reacted at 100° C. for 3 hours, whereby a mixture composition (C-6) with ethylcarbitol acetate containing no polymer fine particles and containing a photo-curable resin having an acid value of 95 in a proportion of 65% was obtained.

Synthetic Example 21 (comparative example)

Ethylcarbitol acetate of 80 parts was added to the same epoxy resin of 100 parts (the bisphenol A type epoxy resin GY-250) as that used in Synthetic Example 19, and the temperature was raised up to 110° C. Then, acrylic acid of 38.9 parts, chromic chloride 6 hydrates of 0.14 part, and methylhydroquinone of 0.12 part were added, and they were reacted for 3 hours. This reaction product was cooled down to 100° C., and then tetrahydrophthalic anhydride of 82.2 parts and lithium chloride anhydrous of 0.14 part were added, and they were reacted at 100° C. for 10 hours. Next, the epoxy resin GY-250 of 50 parts was added, and the reaction was continued at 110° C. for 5 hours.

Further, tetrahydrophthalic anhydride of 33.1 parts and ethylcarbitol acetate of 83.8 parts were added, and they were reacted at 100° C. for 3 hours, whereby a mixture composition (C-7) with ethylcarbitol acetate containing no polymer fine particles and containing a photo-curable resin having an acid value of 92 in a proportion of 65% was obtained.

Examples 12 to 16 and Comparative Examples 7 to 9

The mixture compositions (C-1) to (C-7) obtained in Synthetic Examples 15 to 21 were blended with the components shown in Table 4 to obtain the solder resist ink compositions. The results obtained by evaluating them by the following methods are shown in Table 5.

[Evaluation of developability]
The same as the method used in Examples 1 to 7.

[Evaluation of alkali resistance]
A coated layer was formed in the same manner as that in the evaluation of the developability and irradiated with a luminous energy of 500 mJ/cm² by means of an extra-high pressure mercury lamp of 1 Kw., followed by heating the coated layer at 150° C. for 30 minutes. Then, the coated layer was immersed in a 10% sodium hydroxide aqueous solution for 20 minutes, and the condition of the coated layer after immersing was visually observed for evaluation.

○: No change in the appearance of the coated layer.

X: Coated layer swollen or peeled off.

[Evaluation of adhesion]
A coated layer was formed in the same manner as that in the evaluation of the developability and irradiated with a luminous energy of 500 mJ/cm² by means of an extra-high pressure mercury lamp of 1 Kw. Then, after heating the coated layer at 150° C. for 30 minutes, 100 cross-cuts of 1 mm×1 mm were cut thereon according to a test method of JIS D-0202. Further, the coated layer was heated at 175° C. or 200° C. for 30 minutes, and then the peeling condition after a peeling test with an adhesive tape was visually observed for evaluation.

○: No change at 100/100.

Δ: 80/100 to 99/100.

X: 0/100 to 79/100.

TABLE 5

| | Example | | | | | Comparative Example | | |
|---|---|---|---|---|---|---|---|---|
| | 12 | 13 | 14 | 15 | 16 | 7 | 8 | 9 |
| Evaluation of developability Drying time at 80° C. | | | | | | | | |
| 30 (minutes) | ○ | ○ | ○ | ○ | ○ | ○ | ○ | ○ |
| 40 | ○ | ○ | ○ | ○ | ○ | ○ | ○ | ○ |
| 50 | ○ | ○ | ○ | ○ | ○ | ○ | ○ | ○ |
| 60 | ○ | ○ | ○ | ○ | ○ | ○ | ○ | ○ |
| Alkali resistance | ○ | ○ | ○ | ○ | ○ | ○ | X | ○ |
| Adhesion: | | | | | | | | |
| 175° C. × 30 min. | ○ | ○ | ○ | ○ | ○ | X | Δ | Δ |
| 200° C. × 30 min. | ○ | ○ | ○ | ○ | ○ | X | X | X |

It is obvious that all of the coated layers prepared in the examples of the present invention (Examples 12 to 16) using the ink compositions for solder resists blended with the polymer fine particles are excellent in developability, alkali resistance after the heating step, and adhesion. However, in Comparative Examples 7 to 9 in which the polymer fine particles have not been blended, a distinct difference in the adhesion after the heating step from the examples of the present invention can be observed. This difference is considered to be brought about by the fact that fine cracks and volumetric shrinkage have been caused on the resist layer in the heating step after irradiating with rays to reduce the adhesion to the substrate, and therefore it has been confirmed that the presence of the polymer fine particles can prevent these inconveniences.

Effect of the Invention

According to the production method for the photo-sensitive resin of the present invention, the linearly extended photo-sensitive resin having a suitable amount of carboxyl groups can be obtained, and therefore it has been possible to achieve the compatibility of the tack-free property with the alkali developability in the coated layer before photo-curing, which has been impossible in conventional photo-sensitive resins. Further, the cured coated layer have been excellent in chemical resistance, adhesion, and heat resistance. Accordingly, it has been possible to provide the liquid

TABLE 4

| | Example | | | | | Comparative Example | | |
|---|---|---|---|---|---|---|---|---|
| | 12 | 13 | 14 | 15 | 16 | 7 | 8 | 9 |
| Resin mixture (90 weight parts) | C-1 | C-2 | C-3 | C-4 | C-5 | C-6 | C-6 | C-7 |
| Diluent: polyfunctional monomer Pentaerythritol tetraacrylate | 15 | 15 | 15 | 15 | 15 | 15 | 5 | 15 |
| Diluent: solvent Ethylcarbitol acetate | 20 | 20 | 26 | 20 | 20 | 20 | 20 | 20 |
| Photopolymerization: Irugacure 907[1] | 8 | 8 | 8 | 8 | 8 | 8 | 8 | 8 |
| Epoxy resin: EPN-1138[2] | 20 | 20 | 20 | 20 | 20 | 20 | 20 | 20 |
| Epoxy curing agent: dicyandiamide | 2 | 2 | 2 | 2 | 2 | 2 | 2 | 2 |
| Filler: barium sulfate | 30 | 30 | 30 | 30 | 30 | 30 | 30 | 30 |
| Defoaming agent: Floren AC300[3] | 1.2 | 1.2 | 1.2 | 1.2 | 1.2 | 1.2 | 1.2 | 1.2 |
| Pigment: phthalocyanine green | 0.6 | 0.6 | 0.6 | 0.6 | 0.6 | 0.6 | 0.6 | 0.6 |

(Values shown in TABLE are based on weight parts)
[1]Photopolymerization initiator manufactured by Ciba Geigy Co., Ltd.
[2]Phenol novolak type epoxy resin manufactured by Ciba Geigy Co., Ltd.
[3]Defoaming agent manufactured by Kyoeisha Oil & Fat Chemical Co., Ltd.

photo-sensitive resin compositions useful as a solder resist and an electroless plating resist used for producing printed circuit boards or useful for black matrices and color filters for producing liquid crystal displays. In particular, the liquid photo-sensitive resin compositions in which the polymer fine particles having a Tg of 20° C. or lower are dispersed have been able to form resist layers showing an excellent adhesion to a substrate also in a line in which a heating step is set after forming patterns.

What is claimed is:

1. A production method for a photo-sensitive resin, comprising reacting a resin (A) having two or more (meth) acryloyl groups and at least one carboxyl group in a molecule with a difunctional epoxy resin (B) having two epoxy groups in a molecule and further reacting the resulting resin with a polybasic acid anhydride (II).

2. A production method for a photo-sensitive resin, comprising the steps in the order named:

reacting an epoxy resin (C) having two or more epoxy groups in a molecule with (meth)acrylic acid (I);

reacting the resulting resin with a polybasic acid anhydride (II) to obtain a resin (A) having two or more (meth)acryloyl groups and at least one carboxyl group in a molecule;

reacting the resin (A) with a difunctional epoxy resin (B) having two epoxy groups in a molecule; and reacting the resulting resin with a polybasic acid anhydride (II).

3. A production method for a photo-sensitive resin according to claim 2, wherein the difunctional epoxy resin (B) is a bisphenol epoxy resin.

4. A production method for a photo-sensitive resin according to claim 2, wherein the difunctional epoxy resin (B) is a diglycidyl ether epoxy resin obtained by reacting epichlorohydrin with polyalkylene glycols, or by reacting epichlorohydrin with dihydric alcohols which are adducts of alkylene oxides to bisphenol compounds.

5. A production method for a photo-sensitive resin according to claim 2, wherein the epoxy resin (C) is a novolak epoxy resin having three or more epoxy groups in a molecule.

6. A production method for a photo-sensitive resin according to claim 2, wherein the epoxy resin (C) is a bisphenol epoxy resin having two or more epoxy groups in a molecule.

7. A production method for a photo-sensitive resin according to claim 2, wherein the resin (A) is reacted with the difunctional epoxy resin (B), so that the epoxy groups contained in the difunctional epoxy resin (B) correspond to 0.1 to 0.8 chemical equivalent per 1.0 chemical equivalent of the carboxyl groups contained in the resin (A).

8. A production method for a photo-sensitive resin according to claim 2, wherein the resin (A) having two or more (meth)acryloyl groups and at least one carboxyl group in a molecule is obtained by reacting an epoxy resin (C) having three or more epoxy groups in a molecule with (meth)acrylic acid (I) and alkylphenol (III) represented by the following formula:

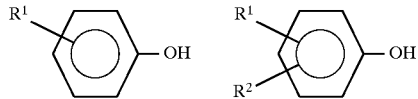

wherein $R^1$ and $R^2$ are the same as or different and represent a saturated or unsaturated alkyl group having 5 to 35 carbon atoms, and then reacting the resultant with a polybasic acid anhydride (II).

* * * * *